United States Patent
Makino et al.

(10) Patent No.: US 7,385,439 B2
(45) Date of Patent: Jun. 10, 2008

(54) ANALOG SWITCH HAVING A MINIMIZED EXTERNAL FLOW OF LEAKAGE CURRENT AND SWITCHED CAPACITOR FILTER INCORPORATING THE ANALOG SWITCH

(75) Inventors: Takanori Makino, Oogaki (JP); Kazuyoshi Nagase, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 203 days.

(21) Appl. No.: 11/253,573

(22) Filed: Oct. 20, 2005

(65) Prior Publication Data
US 2006/0091933 A1 May 4, 2006

(30) Foreign Application Priority Data
Oct. 28, 2004 (JP) ............... 2004-314647

(51) Int. Cl.
*H03K 5/00* (2006.01)
(52) U.S. Cl. .............. 327/558; 327/391; 327/554
(58) Field of Classification Search ............... 327/554, 327/365, 389, 437, 384, 558, 391
See application file for complete search history.

(56) References Cited

U.S. PATENT DOCUMENTS

| | | | | |
|---|---|---|---|---|
| 5,151,619 A | * | 9/1992 | Austin et al. ............... 326/86 |
| 5,541,546 A | * | 7/1996 | Okumura ................... 327/333 |
| 5,966,026 A | * | 10/1999 | Partovi et al. .............. 326/27 |
| 6,031,393 A | * | 2/2000 | Wayner ..................... 326/81 |
| 6,362,653 B1 | * | 3/2002 | Coughlin et al. ............ 326/81 |
| 7,098,694 B2 | * | 8/2006 | Bhattacharya et al. ....... 326/81 |
| 2004/0174209 A1 | | 9/2004 | Makino et al. |

FOREIGN PATENT DOCUMENTS

| | | | |
|---|---|---|---|
| JP | 59126326 A | * | 7/1984 |
| JP | 06301800 | * | 4/1993 |
| JP | 2004-289802 | | 10/2004 |

* cited by examiner

*Primary Examiner*—Dinh T. Le
(74) *Attorney, Agent, or Firm*—Posz Law Group, PLC

(57) ABSTRACT

An analog switch used in a switched capacitor filter has N-channel and P-channel MOS FETs connected in parallel between input and output switch terminals, with capacitor charge currents being periodically produced from the output terminal. The filter derives an output signal with respect to a reference voltage and maintains the switch input and output terminal at the reference voltage, while respective substrate potentials of the N-channel and P-channel MOS FETs are fixed at the reference voltage, so that the analog switch does not produce an external flow of leakage current that can affect the output signal of the filter during each interval when the switch is open.

12 Claims, 12 Drawing Sheets

ANALOG SWITCH HAVING A MINIMIZED EXTERNAL FLOW OF LEAKAGE CURRENT AND SWITCHED CAPACITOR FILTER INCORPORATING THE ANALOG SWITCH

CROSS REFERENCE TO RELATED DOCUMENT

This application is based on and incorporates herein by reference Japanese Patent Application No. 2004-314647 filed on Oct. 28, 2004.

BACKGROUND OF THE INVENTION

1. Field of Application

The present invention relates to an analog switch and to a switched-capacitor filter which incorporates the analog switch.

2. Description of Related Art

Since the characteristic response time of a semiconductor pressure sensor is several milliseconds, such a sensor also detects noise, i.e., high-frequency ripple components. Detection of these high-frequency components will result in a lowering of the detection resolution of the sensor, rendering it unsuitable for applications in which high accuracy is necessary. For that reason, there is a requirement for a circuit which will enable high accuracy to be maintained for such a sensor, even when high-frequency ripple components are detected.

One method of removing of high-frequency components from the output of a semiconductor pressure sensor (referred to in the following simply as a pressure sensor) is to transfer the output signal from the sensor through a low-pass filter circuit having a suitably low cut-off frequency. A specific example is shown in FIG. 8, in which a switched-capacitor filter circuit 200 functions as a low-pass filter that operates on the output detection signal from a pressure sensor, supplied via a differential amplifier 100. This enables the detection frequency range of the pressure sensor to be set appropriately, by selecting a suitably low cut-off frequency for the switched-capacitor filter.

In FIG. 8, the pressure sensor is formed of a set of four piezo-resistive elements R1, R2, R3, R4, each being a semiconductor device with a diffused-impurity layer structure, which are formed on a diaphragm. The piezo-resistive elements R1 to R4 are connected in a bridge circuit as shown, with a current from a current source being passed through two opposing terminals of the bridge circuit and with a voltage which appears between the remaining pair of opposing terminals of the bridge circuit being inputted to the differential amplifier 100. The differential amplifier 100 thereby outputs a pressure detection signal that is inputted to the switched-capacitor filter circuit 200. The switched-capacitor filter circuit 200 is formed of a switched-capacitor filter 103, a frequency-divider circuit 104 and an oscillator circuit 105. The oscillator circuit 105 generates a reference clock signal (shown in the timing diagram of FIG. 10) that is supplied to the frequency-divider circuit 104, which thereby generates a synchronized pair of clock signals respectively designated as the first-phase clock pulse signal $\phi1$ and the second-phase clock pulse signal $\phi2$, as well as their respective inverse signals $\phi1$ bar and $\phi2$ bar. The relationship between the first-phase clock pulse signal $\phi1$ and second-phase clock pulse signal $\phi2$ and the reference clock signal are shown in FIG. 10.

FIG. 9 shows an example of the circuit of a prior art switched-capacitor filter 103, which incorporates analog switches whose operation timings are controlled by the first-phase clock pulse signal $\phi1$ and second-phase clock pulse signal $\phi2$ of FIG. 10. As shown, the switched-capacitor filter 103 is formed of an operational amplifier OP1, first, second and third capacitors C1, C2, C3, and first to sixth analog switches SW1 to SW6, with the capacitor C3 being connected between the output terminal and inverting input terminal of the operational amplifier OP1, and with the non-inverting input terminal of the operational amplifier OP1 receiving a reference voltage Vref. Hence, the operational amplifier OP1 and capacitor C3 are connected as an inverting integrator circuit, with Vref being the common reference level of the input and output signals Vi, Vo of the filter.

Each of the analog switches SW1 to SW6 is made up of an N-channel MOS FET (metal-oxide semiconductor field effect transistor) and a P-channel MOS FET which are connected in parallel. Each of the first to third analog switches SW1 to SW3 is set in the on (i.e., conducting) state only during each interval in which the first-phase clock pulse signal $\phi1$ is at the H level (i.e., high logic level potential) while each of the fourth to sixth analog switches SW4 to SW6 is set in the on state only during each interval in which the second-phase clock pulse signal $\phi2$ is at the H level.

Referring to FIG. 10, four different conditions of the switched capacitor filter circuit 103 of FIG. 9 can be defined as follows:

(a) the condition during each interval in which the clock pulse signal $\phi1$ is at the H level and the clock pulse signal $\phi2$ is at the L level, designated as the first condition S1;

(b) the condition during each interval which immediately follows a first condition S1 interval and in which both of the clock pulse signals $\phi1$, $\phi2$ are at the L level, designated as the second condition S2;

(c) the condition during each interval in which the clock pulse signal $\phi1$ is at the L level and the clock pulse signal $\phi2$ is at the H level, designated as the third condition S3; and (d) the condition during each interval which immediately follows a third condition S3 interval and in which both of the clock pulse signals $\phi1$, $\phi2$ are at the L level, designated as the fourth condition S4.

These conditions will be described with respect to the analog switches SW1 to SW6 of the switched-capacitor filter, referring to the circuit operating diagrams of FIG. 11. As shown, in the first condition S1 each of the analog switches SW1, SW2, SW3 is in the on state, while each of the analog switches SW4, SW5, SW6 is in the off state. In the second condition S2, each of the analog switches SW1 to SW6 is in the off state. In the third condition S3, each of the analog switches SW4, SW5, SW6 is in the on state, while each of the analog switches SW1, SW2, SW3 is in the off state. In the fourth condition S4, each of the analog switches SW1 to SW6 is in the off state.

The cut-off frequency fc of such a filter is proportional to the frequency fs of the clock pulse signals $\phi1$, $\phi2$ multiplied by the ratio of values of the capacitors C2, C3. With a usual type of pressure sensor apparatus, it is necessary to use a cut-off frequency in the range of approximately 100 Hz to 400 Hz. If for example a cut-off frequency of 100 Hz is to be used, this can be achieved by setting the values of 0.25 pf for C2, 60 pf for C3, and 150 kHz for the clock pulse frequency fs. It is readily practicable to implement a circuit having such component values as an integrated circuit. However if the cut-off frequency fc is to be made as low as approximately 1 Hz, then assuming that the same values as above are used for fs and for C2, the value of the capacitor C3 would require to be 6000 pf. It is not practicable to form a capacitor having such a large value within an integrated circuit. Hence, if the cut-off frequency fc is to be made as low as 1 Hz, with all elements of the filter being formed within an integrated circuit, it is necessary to lower the clock pulse frequency fs by a factor of 100:1, to approximately 1.5 kHz.

In FIG. 10, the relationship between the first-phase clock pulse signal $\phi 1$ and the second-phase clock pulse signal $\phi 2$ is such that the interval $\tau$ (the duration of the second condition S2) is made extremely short, being approximately 1 µs. This is achieved by using a non-overlap circuit (not shown in the drawings) which operates on the clock pulse signals $\phi 1$ and $\phi 2$ to provide a delay of approximately 1 µs between each falling edge of the clock pulse signal $\phi 1$ and a subsequent rising edge of the clock pulse signal $\phi 2$. As a result, the transition from the first condition S1 to the third condition S3 is made as short as possible, so that each sampling charge (on the capacitor C1) is rapidly transferred to the capacitor C3. In that way, the operation during the transition from the second condition S2 to the third condition S3 will be substantially unaffected by a flow of leakage current that may occur in the analog switches during high-temperature operation, even if the sampling frequency (i.e., clock pulse frequency) fs is low.

However with such clock timing, the duration of each interval of the fourth condition S4 will be long, so that as can be understood from FIG. 11, problems arise due to leakage currents that flow in the transistors of the analog switch SW5. That is to say, in general during the fourth condition S4, some leakage current (indicated as $I_L$ for condition S4 in FIG. 11) will flow out of or into the analog switch S5, as a charging current or discharge current of the capacitor C3, resulting in a corresponding change in the level of output signal Vo of the filter. This may have a significant effect, when the external flow of leakage current from switch SW5 results from high-temperature leakage currents that flow in the transistors of that switch. The effect increases as the amplitude of variation of the input signal Vi of the filter is reduced. As a result, when there is a high level of external leakage current from the output terminal of switch SW5 (the switch terminal that is connected to the capacitor C3) during each interval of the fourth condition S4, accurate operation cannot be achieved for low values of input signal to the filter, in particular during high-temperature operation of the filter.

FIG. 13 conceptually illustrates leakage current flow paths in the analog switch SW5 of the prior art circuit of FIG. 9 during the fourth condition S4.

FIG. 12 is a cross-sectional view of an example of a configuration for the analog switch SW5 that is typical of the prior art. In that example, the P-channel MOS FET 50 of the switch is formed within an N-well that is formed in an N-type silicon substrate, while the N-channel MOS FET 51 is within a P-well that is formed in the N-type silicon substrate, with a PN junction being formed between the P-well and the N-type substrate. A fixed reverse bias voltage equal to the supply voltage Vcc is applied across this PN junction, so that respective leakage current flow through the source and drain regions, via this PN junction.

Referring to FIGS. 12 and 13, in the case of the N-channel MOS FET 51, leakage currents $I_{50}$ and $I_{51}$ flow from the source and drain electrodes through the P-well to the substrate potential-setting terminal 81, which is fixed at ground potential. In the case of the P-channel MOS FET 50, leakage currents $I_{60}$ and $I_{61}$ flow from a potential-setting terminal 80, which is fixed at Vcc, through the N-well to the source and drain electrodes.

In general, the magnitude of the leakage current $I_{51}$ will not be equal to that of the current $I_{61}$, so that the difference $(I_{51}-I_{61})$, or the difference $(I_{61}-I_{51})$ between these, will appear as an external flow of leakage current, i.e., the leakage current $I_L$ shown in FIG. 11 which flows into or out of the capacitor C3 of the inverting integrator circuit during the fourth condition S4.

Hence in the prior art it has been difficult to utilize such a switched-capacitor filter, having a sufficiently low value of cut-off frequency for effectively operating on the output signal from a semiconductor pressure sensor to achieve accurate pressure sensing over a wide range of pressure values, with that difficult resulting from a high-temperature leakage current that flows to or from an analog switch of the filter during each interval of operation in the fourth condition S4 described above, with that leakage current flowing as a charging or discharge current of an integrator capacitor (C3) of the filter, during each of the long-duration intervals of condition S4.

SUMMARY OF THE INVENTION

It is an objective of the present invention to overcome the problem set out above, by providing an improved analog switch, and improved switched-capacitor filter which incorporates such an improved analog switch, whereby substantially no external flow of leakage current will occur at an output terminal of the analog switch, from which charging currents are repetitively supplied to an integrator capacitor of the switched capacitor filter.

The invention provides an analog switch having an N-channel MOS FET (metal-oxide semiconductor field effect transistor) and a P-channel MOS FET connected in parallel between input and output terminals of the analog switch, with the N-channel MOS FET and the P-channel MOS FET being formed within respective transistor formation regions that are disposed in common within a semiconductor substrate of an integrated circuit. To achieve the above objective, according to a first aspect of the invention, with the analog switch being connected in a circuit in which the input and output terminal of the analog switch are maintained at a common reference voltage, the respective substrate potentials of the N-channel MOS FET and the P-channel MOS FET are each fixed at the reference voltage. As a result, there is no external flow of leakage current at the output terminal of the analog switch, even when operating at a high temperature.

Thus, such an analog switch can be used to transfer a charge amount (i.e., corresponding to an input signal sample) to a small-value capacitor that is connected to the output terminal of the switch, and can thereafter be held in the off state during a substantially long time interval without any significant level of leakage current flowing to charge or discharge the small-value capacitor during that time interval. Since the small-value capacitor can be an integrator capacitor of a switched capacitor filter, the invention enables a switched capacitor filter to be realized which functions as a low-pass filter having a low cut-off frequency, yet can be implemented entirely within a single-chip integrated circuit.

According to another aspect, the invention provides an analog switch that is configured with each of the transistor formation regions being enclosed at its side faces and lower face by a continuously extending region of dielectric material such a silicon dioxide. Since the transistor formation regions are thereby effectively electrically isolated from one another, the respective substrate potentials of the P-channel MOS FET and N-channel MOS FET of the analog switch can be readily set to arbitrary values, with no possibility of leakage current flowing between the transistors.

From another aspect, the invention provides an analog switch comprising a first N-channel MOS FET and a first P-channel MOS FET connected in parallel between input and output terminals of the analog switch, with the first N-channel MOS FET and the first P-channel MOS FET having substrate potential-setting terminals which are fixed at respectively different values of substrate potential, and with the analog switch being connected in a circuit in which the input and output terminals of the analog switch are maintained at a fixed reference voltage. This analog switch is characterized in that the values of substrate potential of the first N-channel MOS FET and the first P-channel MOS FET are respectively higher than and lower than the reference voltage, by identical amounts. The analog switch is also characterized in comprising:

(a) a second P-channel MOS FET, which has identical operating characteristics to the first P-channel MOS FET and which has one of its drain and source terminals connected to the substrate potential-setting terminal of the first N-channel MOS FET, and which has a substrate potential-setting terminal that is connected to the output terminal of the analog switch, and (b) a second N-channel MOS FET, which has identical operating characteristics to the first N-channel MOS FET and which has one of its drain and source terminals connected to the substrate potential-setting terminal of the first P-channel MOS FET, and has a substrate potential-setting terminal that is connected to the output terminal of the analog switch.

The flow of leakage currents in such an analog switch is illustrated in FIG. 7 (described in more detail hereinafter). Basically, two PN junction leakage current paths exist, each extending from the substrate potential (2Vref) of the first P-channel MOS FET Qp1, which is higher than the reference voltage by the amount Vref, to the substrate potential of the second N-channel MOS FET Qn2 (ground potential), which is lower than the reference potential by the amount Vref. Specifically, the first leakage current path extends through a PN junction within the first P-channel MOS FET Qp1 and a PN junction in the second P-channel MOS FET Qp2, while the second leakage current path extends through a PN junction within the second N-channel MOS FET Qn2 and a PN junction in the first N-channel MOS FET Qn1. With this configuration, due to the fact that the transistors Qp1 and Qp2 have identical operating characteristics, and similarly the transistors Qn1 and Qn2 have identical operating characteristics, there is no net outflow or inflow of PN junction leakage current at the output terminal of the analog switch when it is in the off state, so that no current will flow to or from a small-value capacitor that is connected to the switch output terminal, even under high-temperature operation.

Thus, such an analog switch can be used to transfer a charge amount (i.e., corresponding to an input signal sample) to a small-value capacitor that is connected to the output terminal of the switch, and thereafter be held in the off state during a substantially long interval, without any significant level of leakage current flowing to charge or discharge the capacitor during that interval. Since the small-value capacitor can be an integrator capacitor of a switched capacitor filter, such an analog switch enables a switched capacitor filter to be realized which functions as a low-pass filter having a low cut-off frequency, yet can be implemented entirely within a single-chip integrated circuit.

DESCRIPTION OF PREFERRED EMBODIMENTS

First Embodiment

Figure 8:
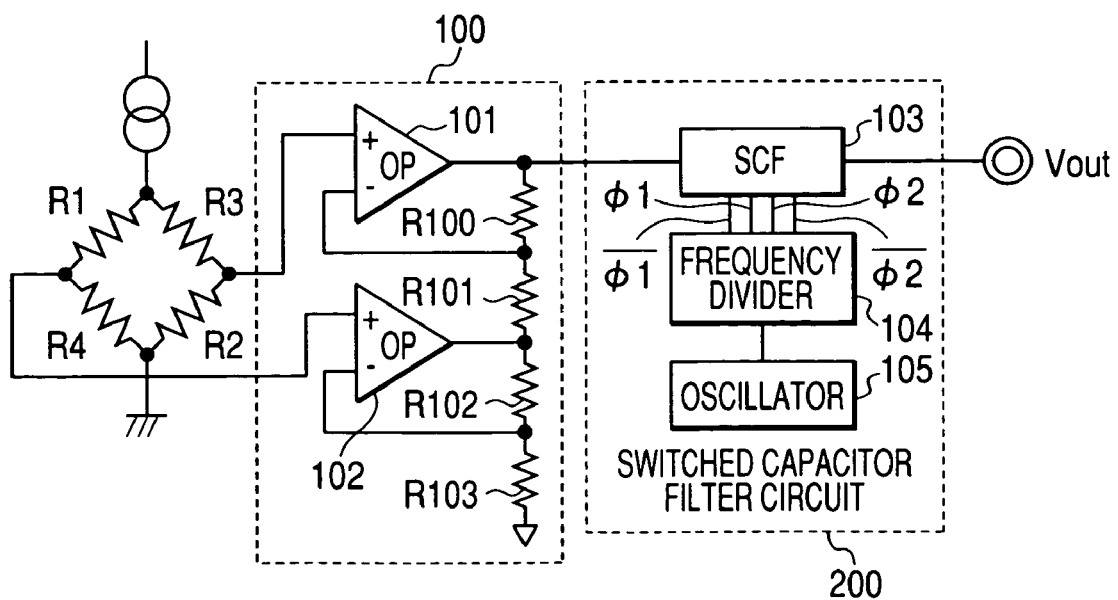
FIG. 8 is a circuit diagram of a pressure sensor which utilizes a switched-capacitor filter.

A first embodiment of a switched-capacitor filter will be described in the following, referring first to the circuit diagram of the embodiment shown in FIG. 1. This embodiment corresponds to the switched-capacitor filter 103 shown in FIG. 8, and is utilized as described hereinabove for operating on the output signal from a semiconductor pressure sensor, transferred to the switched-capacitor filter 103 through the differential amplifier 100. The four piezo-resistive elements R1 to R4 (each formed of impurity-diffused layers) constituting the pressure sensor are preferably formed on a thin diaphragm that is mounted on a silicon substrate. The connection point of the piezo-resistive elements R1, R3 is coupled to receive a fixed current, while the junction of the piezo-resistive elements R2, R4 is connected to ground potential. The connection point of the piezo-resistive elements R2, R3 is coupled to the non-inverting input terminal of the operational amplifier 101 of the differential amplifier 100, while the connection point of the piezo-resistive elements R1, R4 is coupled to the non-inverting input terminal of the operational amplifier 102 of the differential amplifier 100. Resistors R100, R101, R102, R103 in the differential amplifier 100 are connected in series between the output terminal of the operational amplifier 101 and ground potential. In addition, the resistor R100 is connected between the inverting input terminal and output terminal of the operational amplifier 101, while the resistor R102 is connected between the inverting input terminal and output terminal of the operational amplifier 102.

The output terminal of the operational amplifier 101 is connected to the input terminal of the switched-capacitor filter 103 in the switched-capacitor filter circuit 200.

Figure 9:
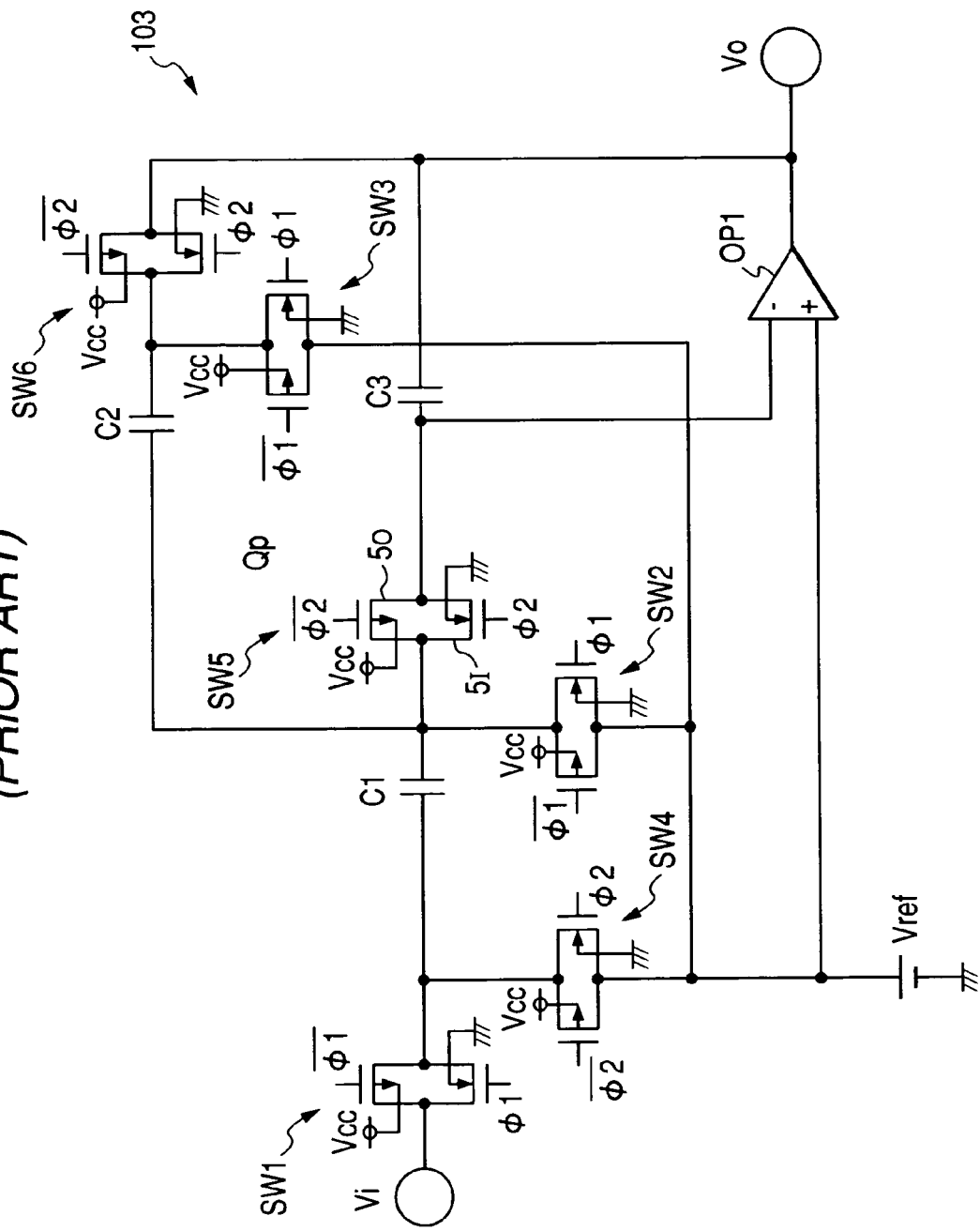
FIG. 9 is a circuit diagram of a prior art configuration of a switched-capacitor filter.

The switched-capacitor filter circuit 200 functions as a low-pass filter, formed of the switched-capacitor filter 103, frequency-divider circuit 104 and oscillator circuit 105 as described hereinabove with respect to the prior art, with the aforementioned first and second clock pulse signals $\phi1$, $\phi2$, and the respective inverses of these signals, being produced by the frequency-divider circuit 104 and supplied to the switched-capacitor filter 103. However instead of the prior art circuit of FIG. 9 being utilized as the switched-capacitor filter 103, the switched-capacitor filter embodiment shown in FIG. 1 is utilized.

Figure 1:
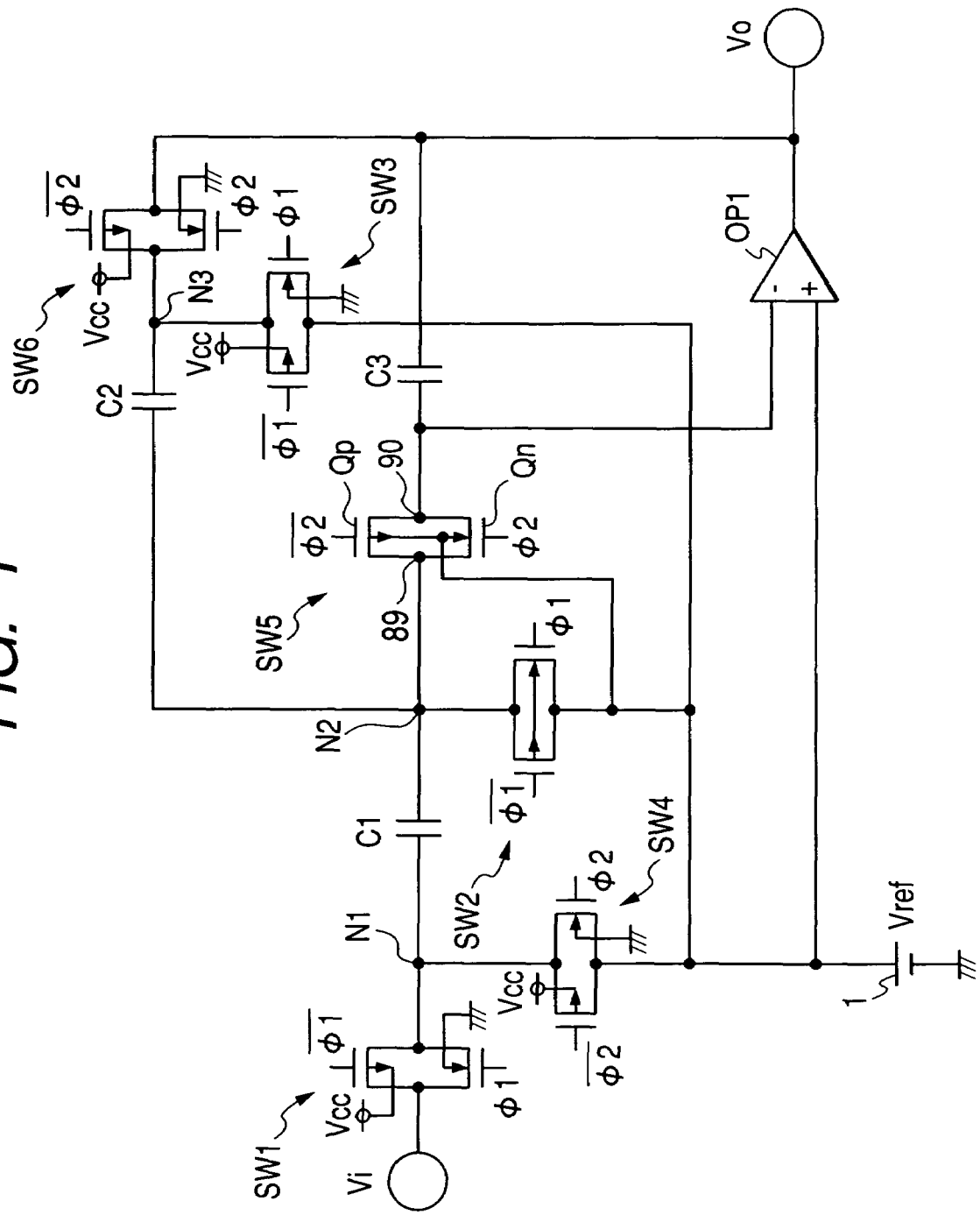
FIG. 1 is a circuit diagram of a first embodiment of a switched-capacitor filter.

As shown in FIG. 1, this embodiment is made up of an operational amplifier OP1, first, second and third capacitors C1, C2, C3, and first to sixth analog switches SW1 to SW6, and a reference DC voltage source 1 supplying a reference voltage Vref. Each of the analog switches SW1 to SW6 is made up of an N-channel MOS FET and a P-channel MOS FET which are connected in parallel between the input/output terminals of the corresponding analog switch. Each of the first to third analog switches SW1 to SW3 is closed (set in the on state) only during each interval in which the first-phase clock pulse signal $\phi1$ is at the H level, while each of the fourth to sixth analog switches SW4 to SW6 is closed only during each interval in which the second-phase clock pulse signal $\phi2$ is at the H level.

Also as shown in FIG. 1, the non-inverting input terminal of the operational amplifier OP1 is connected to receive the reference voltage Vref. The first analog switch SW1 is connected between the input terminal of the filter (which receives an input signal indicated as Vi from the differential amplifier 100) and a first connection node N1, while the fourth analog switch SW4 is connected between that connection node N1 and the non-inverting input terminal of the operational amplifier OP1. The first capacitor C1 is connected between the first connection node N1 and a second connection node N2, while the second analog switch SW2 is connected between the second connection node N2 and the non-inverting input terminal of the operational amplifier OP1. The fifth analog switch SW5 is connected between the second connection node N2 and the inverting input terminal of the operational amplifier OP1. The second capacitor C2 is connected between the first connection node N1 and a third connection node N3, while the third capacitor C3 is connected between the inverting input terminal of the operational amplifier OP1 and the output terminal of the operational amplifier OP1, i.e., the output terminal of the filter (which produces an output signal indicated as Vo). As described for the prior art example, the third capacitor C3 functions as an integrator capacitor of the switched capacitor filter, being connected between the third connection node N3 and the non-inverting input terminal of the operational amplifier OP1. The sixth analog switch SW6 is connected between the third connection node N3 and the output terminal of the operational amplifier OP1.

Figure 10:
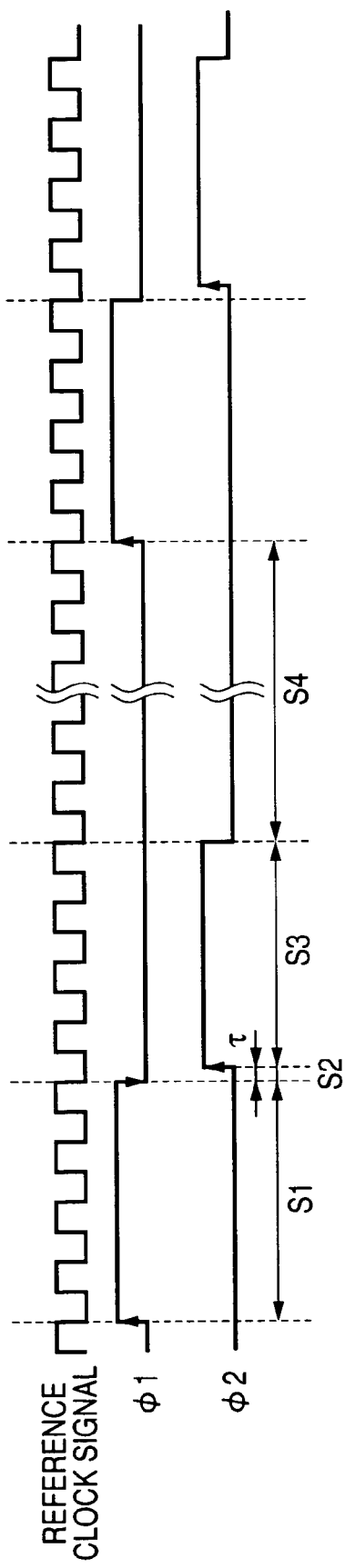
FIG. 10 is a timing diagram of clock signals which control analog switches in a switched-capacitor filter.
Figure 11:
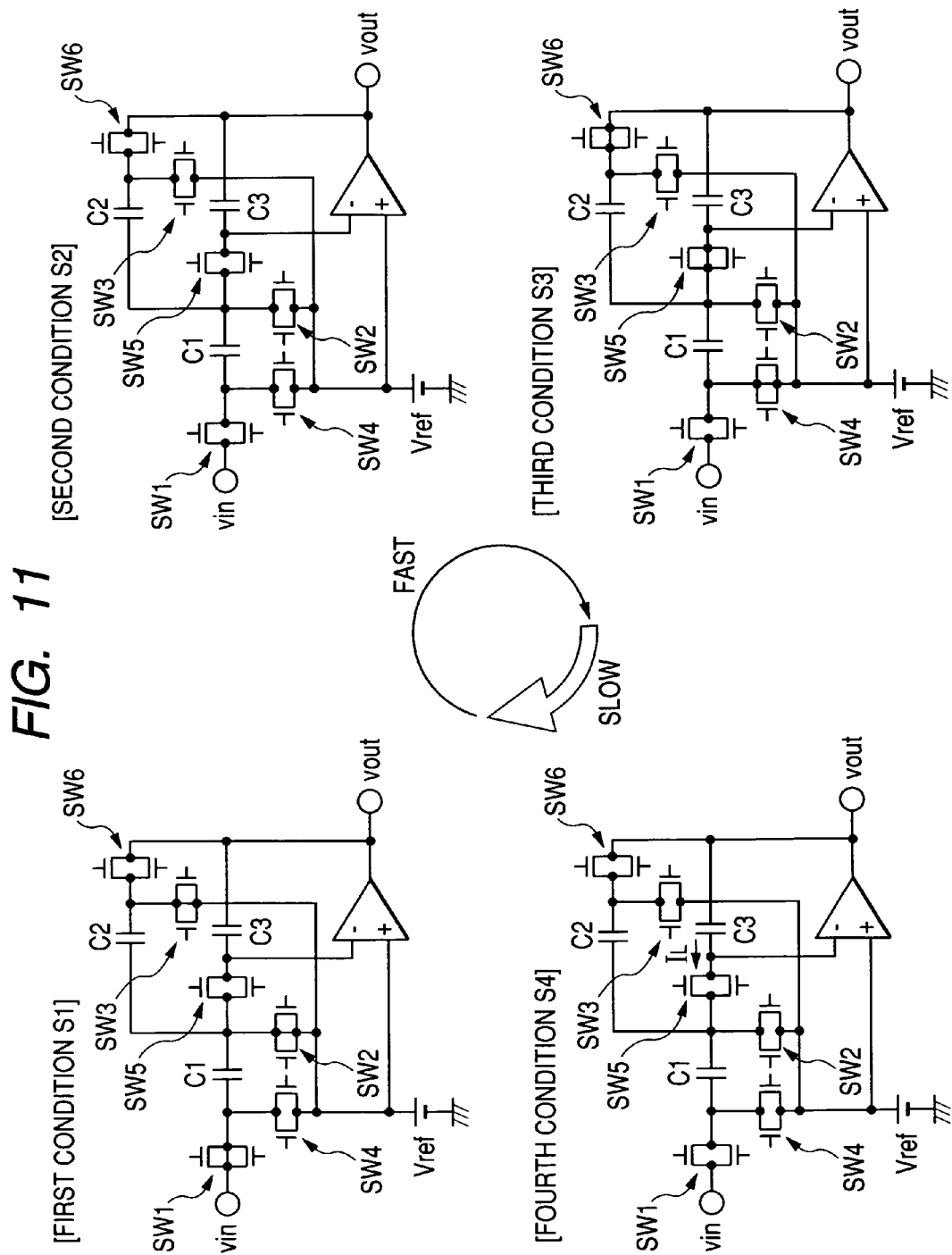
FIG. 11 shows circuit diagrams for use in describing the transitions of a switched-capacitor filter through first to fourth operating conditions S1 to S4.

With this embodiment, 2-phase clock pulse signals of the form shown in FIG. 10 and described hereinabove are utilized to control the analog switches SW1 to SW6 of the embodiment of FIG. 1, i.e., the clock pulse signals $\phi1$ and $\phi2$ as indicated in FIG. 1. Referring again to FIGS. 10 and 11, in the first condition S1 in which the clock pulse signal $\phi1$ is at the H level and the clock pulse signal $\phi2$ is at the L level, each of the first to third analog switches SW1, SW2, SW3 is in the on state, and each of the fourth to sixth analog switches SW4, SW5, SW6 is in the off state. As a result, the first capacitor C1 becomes charged to the input signal voltage, while the voltage across the second capacitor C2 is discharged to zero, and no charging or discharging of the third capacitor C3 occurs.

Next, in the second condition S2, which immediately succeeds the first condition S1 and in which both of the clock pulse signals $\phi1$ and $\phi2$ are at the L level, each of the analog switches SW1 to SW6 is in the off state. As a result, no charging or discharging of any of the capacitors C1, C2, C3 occurs in that condition.

During the third condition S3 in which the clock pulse signal $\phi1$ is at the L level and the clock pulse signal $\phi2$ is at the H level, each of the analog switches SW1, SW2, SW3 is in the off state, while each of the analog switches SW4, SW5, SW6 is in the on state. As a result, the second and third capacitors C2, C3 become connected in parallel, and the voltage across the terminals of the capacitor C1 is discharged to zero, with the discharge current of the capacitor C1 flowing as a charging current into the parallel combination of the capacitors C2, C3. This result in an increase in the voltage across that parallel combination. However in this condition, since the capacitors C2, C3 become connected between the output terminal and inverting input terminal of the operational amplifier OP1, the potential at the inverting input terminal is maintained at the potential of the non-inverting input terminal. Thus the input and output terminals of the fifth analog switch SW5 are set at the Vref potential.

Next, in the fourth condition S4, which immediately succeeds the third condition S3 and in which both of the clock pulse signals $\phi1$ and $\phi2$ are at the L level, each of the analog switches SW1 to SW6 is in the offstate, while the Vref potential is directly applied to the input terminal of the analog switch SW5 via the analog switch SW2. As a result, no charging or discharging of any of the capacitors C1, C2, C3 occurs, and the input and output terminals of SW5 are maintained at the Vref potential.

On completion of the S4 condition interval, operation returns to the first condition S1, with the sequence S1, S2, S3, S4 being cyclically repeated.

In order to achieve a low-pass filter having a low value of cut-off frequency fc, e.g., 1 Hz, the frequency fs of the clock pulse signals $\phi1$, $\phi2$ is set as 1.5 kHz with this embodiment, i.e., a substantially low rate of sampling the input signal of the filter is utilized. In addition, the duration of the interval $\tau$ of the second condition S2 is made as short as possible (e.g., approximately 1 microsecond) while preventing occurrence of simultaneous conduction by each of the analog switches SW1 to SW6. That is to say, the duration should be made:

(a) sufficiently long to ensure that no overlap will occur between a conducting condition of each of the analog switches SW1, SW2, SW3 and a conducting condition of each of the analog switches SW4, SW5, SW6, and (b) sufficiently short to ensure that excessive adverse effects will not occur as a result of a flow of high-temperature leakage current during each interval $\tau$.

To satisfy that combination of conditions, in the case of each analog switch being implemented using high-speed MOS FETs, the duration of $\tau$ should preferably be set to a value within the range 0.6 to 2 microseconds.

As an alternative condition, the duration of the interval $\tau$ of the second condition S2 should be made shorter than a duration whereby an amount of error with respect to a target value of DC gain of the low-pass filter equals a predetermined allowable error amount (for example, 3%) while also being sufficiently long to ensure that simultaneous conduction by the analog switches that are controlled by the first clock pulse signal φ1 and the analog switches that are controlled by the second clock pulse signal φ2 will not occur. The amount of error in the DC gain of the low-pass filter is determined mainly by the amount of change that occurs in the voltage to which the first capacitor C1 is charged (i.e., amount of charge leakage of that capacitor) during the interval τ. For example, a lowering of that charge voltage by 3% during the interval τ, due to charge leakage, will result in an amount of DC gain error of approximately 3%.

The amount of change in the charge voltage of the first capacitor C1 that occurs during each interval τ can be obtained by direct measurement of that voltage, or can be derived based on measuring the analog switch leakage current.

Figure 2:
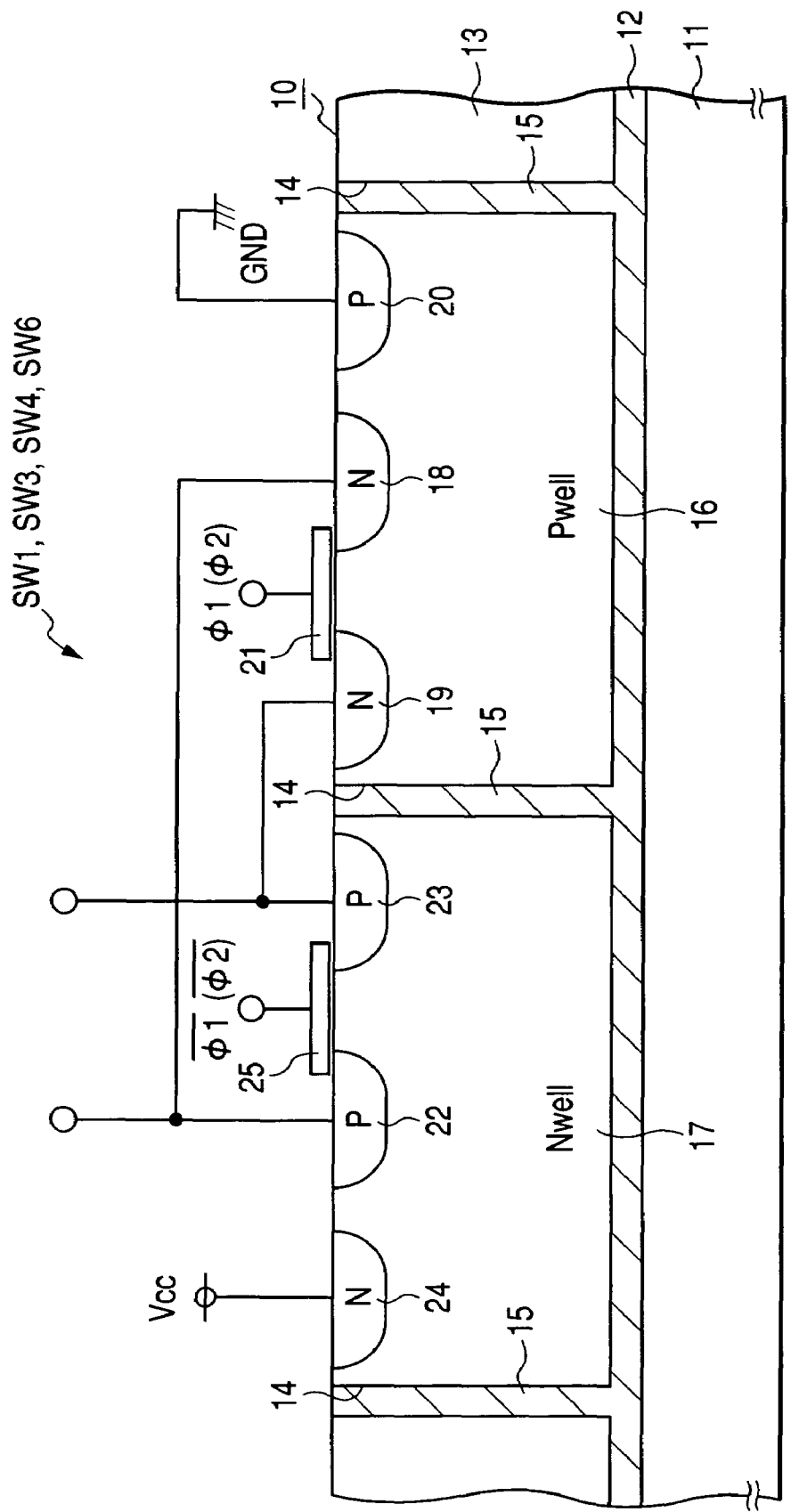
FIG. 2 is a cross-sectional view showing the configuration of each of first, third, fourth and sixth analog switches SW1, SW3, SW4, SW6 in the embodiment of FIG. 1.
Figure 3:
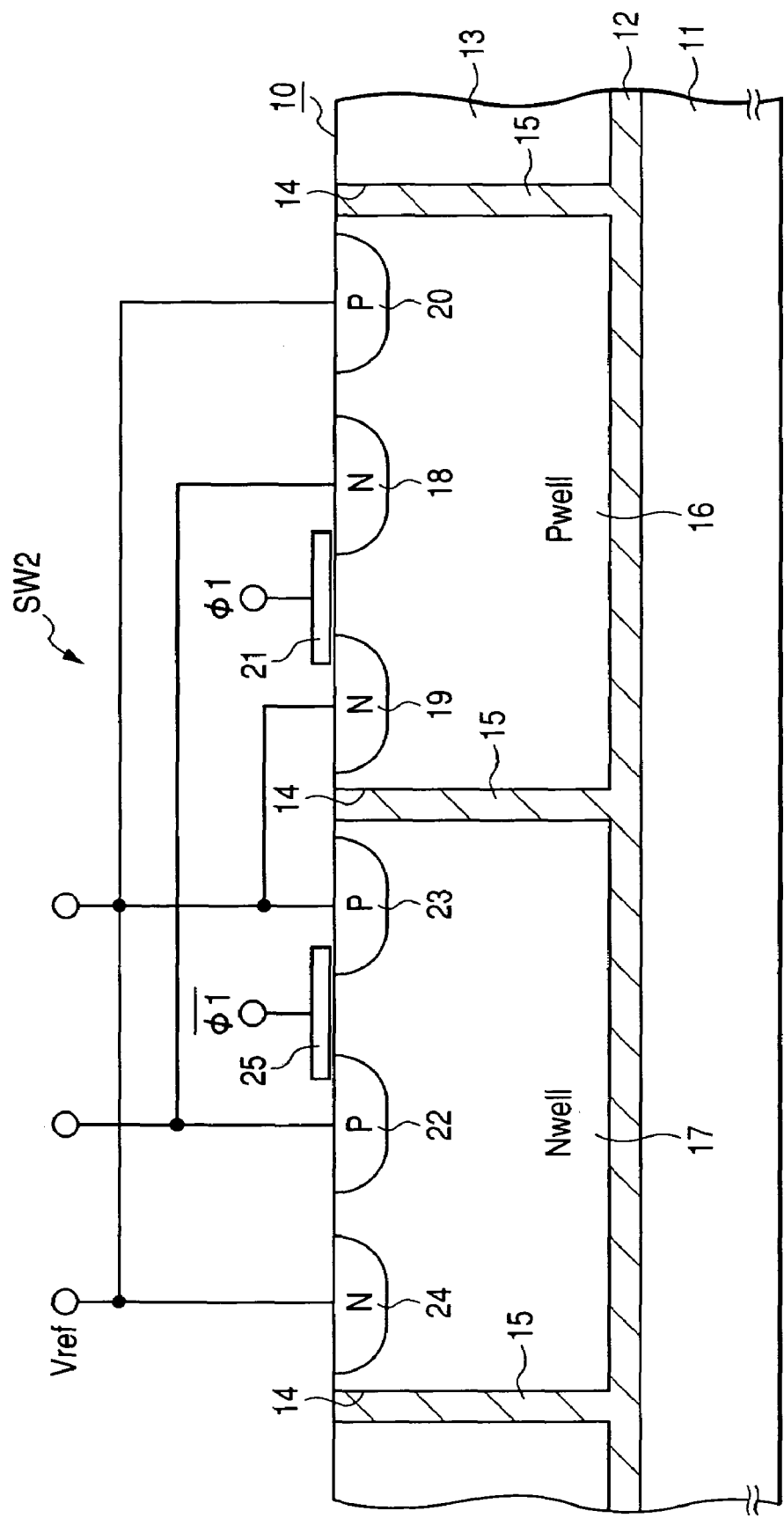
FIG. 3 is a cross-sectional view showing the configuration of a second analog switch SW2 in the embodiment of FIG. 1.
Figure 4:
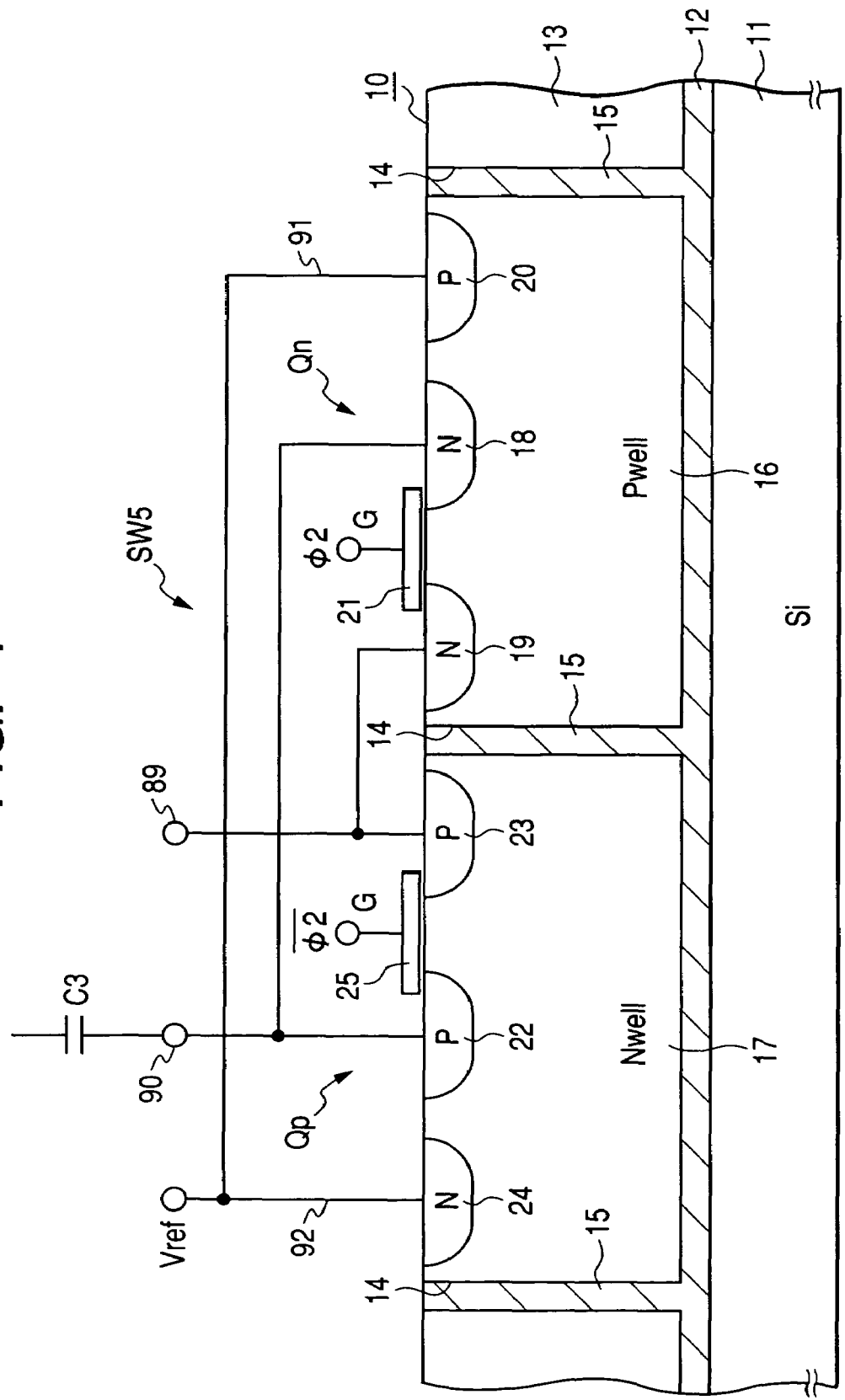
FIG. 4 is a cross-sectional view showing the configuration of a fifth analog switch SW5 in the embodiment of FIG. 1.

FIG. 2 is a cross-sectional view of a specific configuration for each of the analog switches SW1, SW3, SW4, SW6 of this embodiment, while FIG. 3 is a cross-sectional view of a specific configuration for the second analog switch SW2, and FIG. 4 is a cross-sectional view of a specific configuration for the fifth analog switch SW5.

As shown in FIGS. 2, 3 and 4, each analog switch is formed in a semiconductor substrate 10, having a SOI (Silicon on Insulator) substrate configuration. The semiconductor substrate 10 is formed of a silicon substrate 11 having a (thin film) silicon layer 13 that is separated from the silicon substrate 11 by a silicon oxide (thin film) buried layer 12. Trenches 14 are formed in the silicon layer 13, extending from the upper face (as seen in the drawings) of the silicon layer 13 down to the silicon oxide buried layer 12. Each of the trenches 14 is filled with a silicon oxide thin film 15. These trenches 14 serve to separate respective MOS FET formation regions, i.e., a P-channel MOS FET formation region 17 and a N-channel MOS FET formation region 16, so that each of these MOS FET formation regions 16, 17 is enclosed at its side faces and lower face by continuously extending regions of dielectric material (silicon oxide).

The N-channel MOS FET formation region 16 is formed with a P-well therein, having respective N-type regions 18, 19 and a P-type contact region 20 formed in the upper face of that P-well, and having a gate electrode 16 formed on that upper face, extending between the N-type regions 18, 19 but separated from these by a gate oxide film.

The P-channel MOS FET formation region 17 is formed with an N-well therein, having respective P-type regions 22, 23 and an N-type contact region 24 formed in the upper face of the N-well, and having a gate electrode 25 formed on that upper face, extending between the P-type regions 22, 23 and separated from these by a gate oxide film.

The N-type region 18 and the P-type region 22 are connected in common to one of the input and output terminals of the analog switch, while N-type region 19 and P-type region 23 are connected in common to the other one of the input and output terminals.

The power supply voltage Vcc is applied to the N-type region 24 in each of the first, third and sixth analog switches SW1, SW3 and SW6, while the P-type region 20 in each of these analog switches is connected to ground potential.

Referring to FIG. 3, showing the specific configuration of the second analog switch SW2 of this embodiment, the reference voltage Vref is applied to the N-type region 24 and the P-type region 20 in that analog switch.

Referring to FIG. 4, showing the specific configuration of the fifth analog switch SW5 of this embodiment, the substrate potential-setting input terminals of the P-channel MOS FET Qp and the N-channel MOS FET Qn of the switch are respectively designated as 92 and 91, while the input and output terminals of switch SW5 are designated as 89 and 90 respectively. The reference voltage Vref is applied to the N-type region 24 and the P-type region 20 in switch SW5 via the respective substrate potential-setting terminals 92 and 91. It can thus be understood that whereas with the prior art example of FIG. 12, in which the power supply voltage Vcc and ground potential are applied as respective substrate potentials of the P-channel MOS FET and the N-channel MOS FET of an analog switch, with the configuration shown in FIG. 4, the substrate potentials of the P-channel MOS FET and the N-channel MOS FET of the analog switch are each fixed at the reference voltage Vref As described above, the input terminal 89 and the output terminal 90 of the fifth analog switch SW5 are maintained at the reference potential Vref.

Hence, referring again to FIG. 4, there will be no potential difference between the substrate potential-setting terminals 92, 91 of transistors Qp, Qn and the output terminal 90 of the analog switch SW5, or between these substrate potential-setting terminals 92, 91 of transistor Qn and the input terminal 89 of the analog switch SW5. In that way, the fifth analog switch SW5 is configured to suppress any external flow of high-temperature leakage current flow which adversely affects the switched capacitor filter as described hereinabove (i.e., the leakage current $I_L$ shown for condition S4 in FIG. 11 described above, cannot occur). Thus, accurate operation of the switched capacitor filter at low values of input signal Vi of the switched capacitor filter can be achieved.

In addition, due to the use of a trench configuration for the semiconductor structure of each of the analog switches SW1 to SW5 of this embodiment, the respective substrate potentials of the P-channel MOS FET Qp and N-channel MOS FET Qn in each of the analog switches can be freely set at arbitrary values, without occurrence of leakage current flow between the transistors of a switch. With the fifth analog switch SW5, these substrate potentials are fixed at an identical value as described above, i.e., the reference voltage Vref, at which the output terminal of that switch is maintained.

Figure 12:
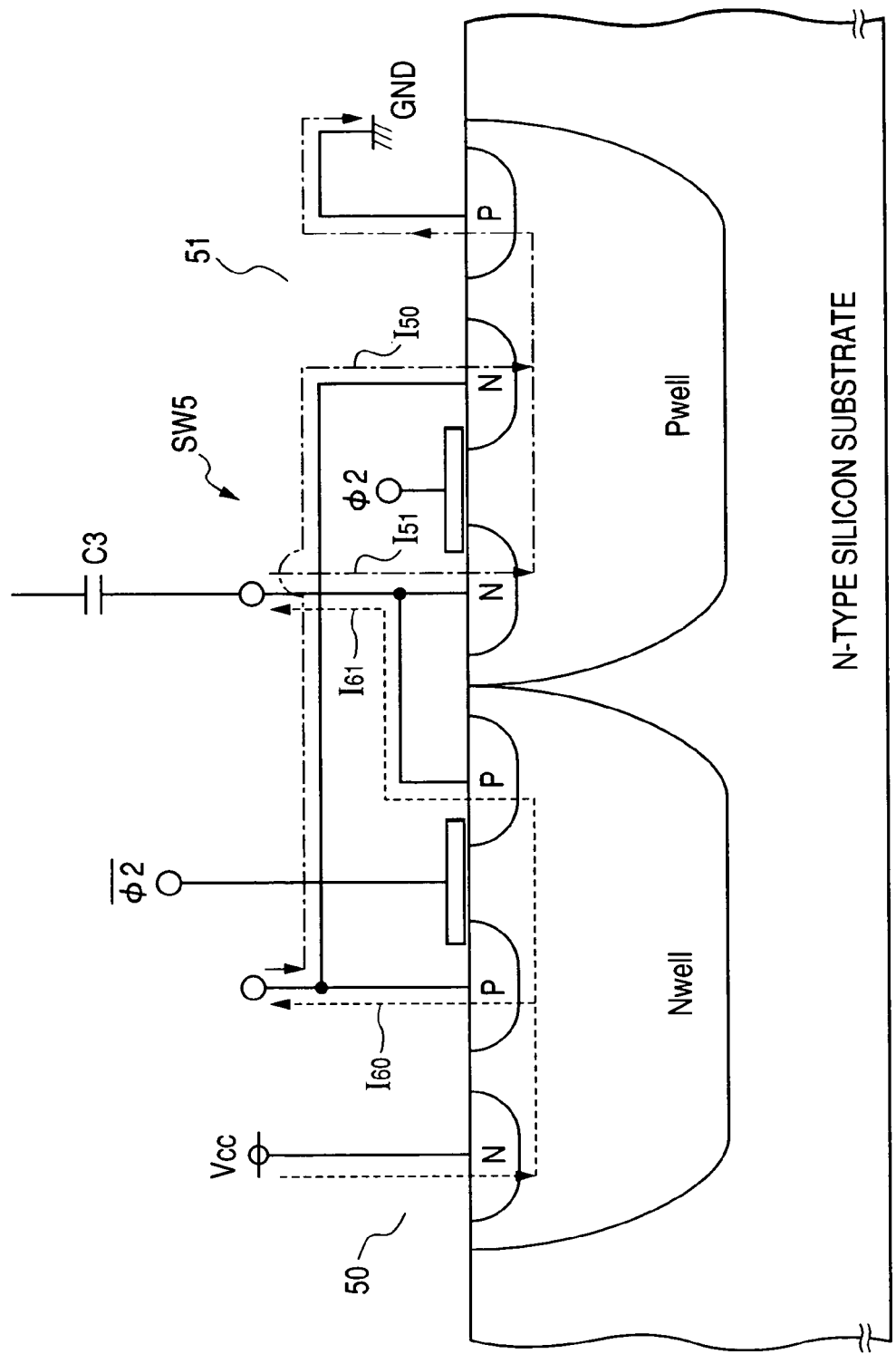
FIG. 12 is a cross-sectional view of a prior art example of a fifth analog switch SW5 used in the switched-capacitor filter of FIG. 9.

It can thus be understood that with the structure of the fifth analog switch SW5 shown in FIG. 4, since each of the transistors Qp and Qn of that switch has a substrate potential that is set as Vref, and since the output terminal of that analog switch is inherently held at the Vref potential, the leakage currents $I_{51}$, $I_{61}$ of the prior art analog switch example of FIG. 12 do not arise. Thus, each interval of the aforementioned fourth condition S4 of the switched capacitor filter can be made substantially long, while utilizing a value of capacitance for the capacitor C3 that is sufficiently small to be appropriate for forming within an integrated circuit chip, so that it becomes possible to achieve satisfactory operation of a single-chip integrated circuit switched capacitor filter having a value of cut-off frequency as low as 1 Hz.

The features of the first embodiment described above can be summarized as follows. As shown in FIG. 4, considering the N-channel MOS FET Qn and P-channel MOS FET Qp which constitute the fifth analog switch SW5 of the switched-capacitor filter, each transistor is formed on a substrate 10 of a single integrated circuit chip, in respective regions 16, 17 of the substrate 10, with each of these regions being surrounded by dielectric bodies (12, 15) at the bottom and side faces. The respective substrate regions 16, 17 of the transistors Qn, Qp are fixedly set at a common potential, which is the reference voltage Vref of the switched-capacitor filter. Hence, due to the fact that the substrate potential of each of the transistors Qn, Qp of the analog switch SW5 is identical to the potential at which the input and output terminals of that analog switch are maintained (Vref), any external flow of PN junction leakage current at the output terminal of switch SW5 is effectively suppressed. Thus, the problems affecting the low-frequency operation performance of the switched-capacitor filter, resulting from leakage current as described hereinabove, are eliminated.

Figure 13:
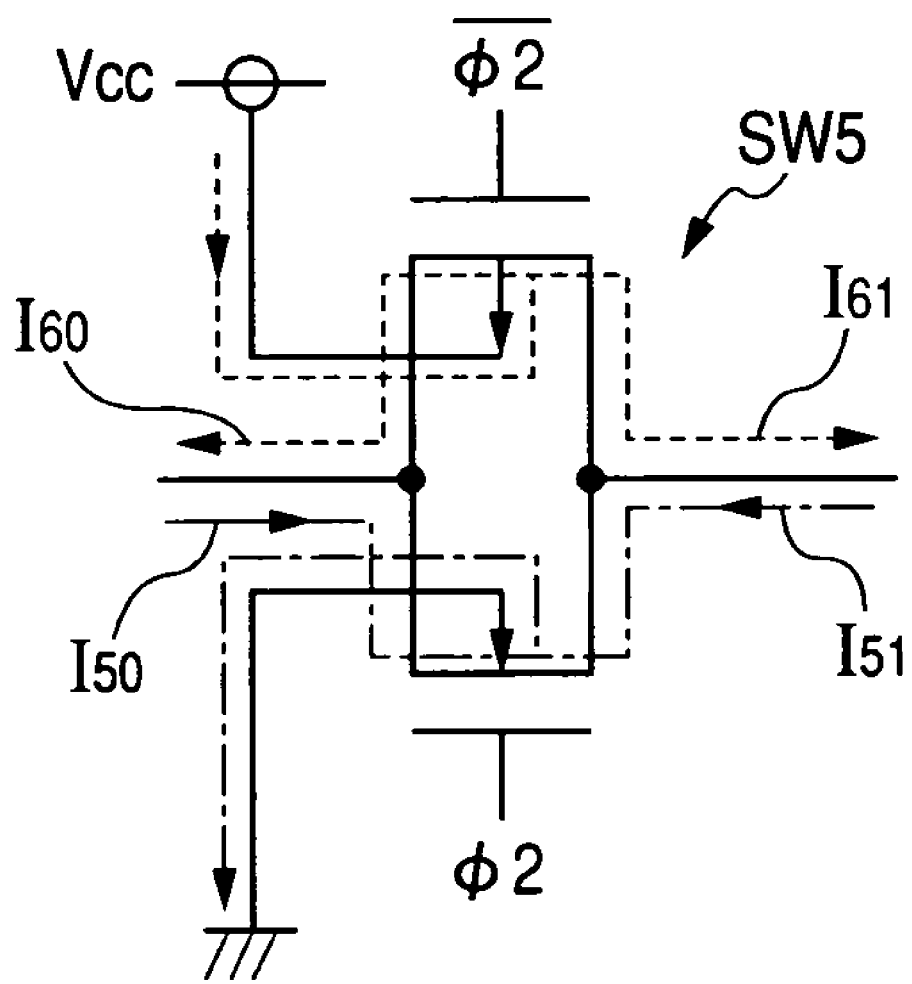
FIG. 13 is a conceptual circuit diagram for illustrating leakage current flow paths in the prior art analog switch example of FIG. 12.

Non-linearity of the temperature characteristic of the offset voltage of the switched-capacitor filter (resulting from the temperature-dependence of the level of externally-flowing leakage current $I_L$ at the output terminal of the fifth analog switch SW5, illustrated in FIG. 13) is thereby substantially eliminated, and greater accuracy of the filter operation achieved. Furthermore, due to the use of continuously extending dielectric regions (silicon oxide thin films) for mutually isolating the transistors Qn, Qp in each of the analog switches, the substrate potential of each transistor can be readily set at an appropriate value without danger of leakage current flow between the transistors of an analog switch.

It should be noted that it would be equally possible to obtain the latter advantage if the transistors of the analog switch have a Bi-CMOS (Bipolar Complementary Metal Oxide Semiconductor) structure. It is only necessary to ensure that the respective substrate potentials of the transistors can be set at arbitrary values.

Second Embodiment

A second embodiment of a switched-capacitor filter will be described in the following, with only the points of difference from the first embodiment being described in detail. Specifically, the second embodiment differs from the first embodiment shown in FIG. 1 with respect to the configuration of the fifth analog switch SW5, and the substrate potential-setting connections of the second analog switch SW2.

Figure 5:
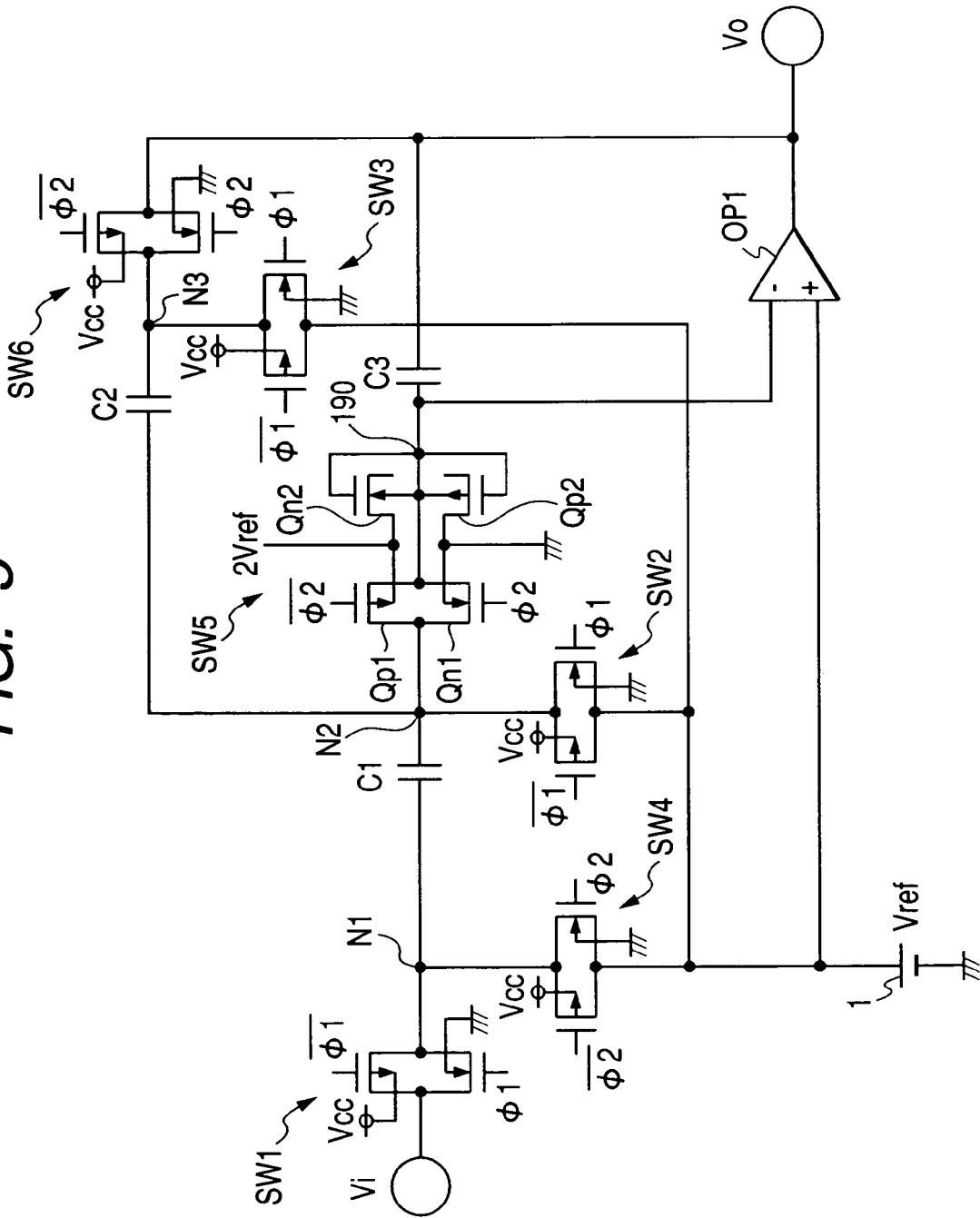
FIG. 5 is a circuit diagram of a second embodiment of a switched-capacitor filter.
Figure 6:
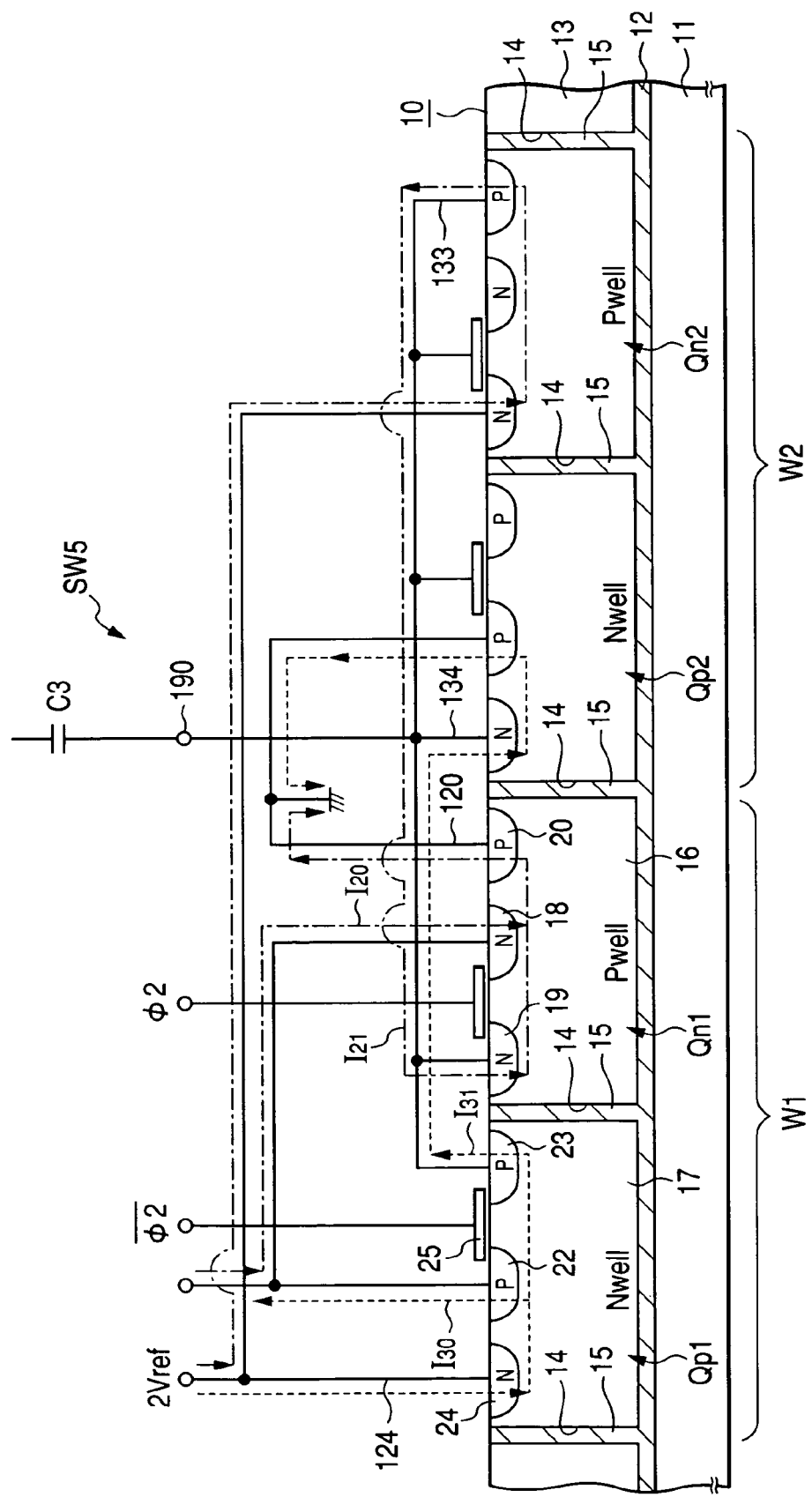
FIG. 6 is a cross-sectional view showing the configuration of a fifth analog switch SW5 of the second embodiment.

FIG. 5 is a circuit diagram of the second embodiment, while FIG. 6 is a cross-sectional view showing a specific configuration for the fifth analog switch SW5 of the second embodiment, used in place of the configuration of FIG. 4 for the first embodiment.

As shown in FIG. 5, the fifth analog switch SW5 of the second embodiment is formed of a first N-channel MOS FET Qn1, a first P-channel MOS FET Qp1, a second N-channel MOS FET Qn2, and a second P-channel MOS FET Qp2. The transistors Qn1, Qp1, Qn2, Qp2 of the fifth analog switch SW5 are formed as shown in FIG. 6 on a substrate 10 of a single integrated circuit (i.e., on the same integrated circuit chip) of a switched capacitor filter, with these transistors formed in respective transistor formation regions within the substrate 10, that are mutually separated by trenches filled with dielectric material such that each transistor formation region is continuously enclosed at the side faces and lower face thereof by regions of dielectric material (silicon oxide). This is as described for the transistors of each analog switch of the first embodiment, so that detailed description is omitted.

The first N-channel MOS FET Qn1 and first P-channel MOS FET Qp1 are connected in parallel between input and output terminals of the switch SW5, with the output terminal designated as 190. The substrate potentials of the transistors Qn1, Qp1 are fixed at respectively different values. Specifically, with this embodiment the substrate potential of the first N-channel MOS FET Qn1 is set at 0 V (i.e., ground potential) while that of the second P-channel MOS FET Qp2 is set at twice the reference voltage Vref. Thus, the substrate potential of the first N-channel MOS FET Qn1 differs from the reference voltage Vref of the switched-capacitor filter by an amount −Vref, while that of the first P-channel MOS FET Qp1 differs from the reference voltage Vref by an amount +Vref.

Thus, the substrate potentials of the transistors Qp1, Qn1 are respectively higher than and lower than the reference voltage of the switched-capacitor filter, by identical amounts.

The clock pulse signal $\phi 2$ is applied to the gate of the first N-channel MOS FET Qn1 while the inverse clock pulse signal $\phi 2$-bar is applied to the gate of the first P-channel MOS FET Qp1.

The N-channel MOS FETs Qn1, Qn2 have identical operating characteristics, while similarly, the P-channel MOS FETs Qp1, Qp2 have identical operating characteristics.

As shown in FIG. 6, one of the source and drain terminals of the second P-channel MOS FET Qp2 is connected to the substrate potential-setting terminal 120 of the first N-channel MOS FET Qn1 (which is set at ground potential as described above), while the substrate potential-setting terminal 134 of the second P-channel MOS FET Qp2 is connected to the output terminal 190 of switch SW5 (i.e., to the inverting input terminal of the operational amplifier OP1, and to the opposite side of the third capacitor C3 from the side that is connected to the output terminal of operational amplifier OP1). One of the source and drain terminals of the second N-channel MOS FET Qn2 is connected to the substrate potential-setting terminal 124 of the first P-channel MOS FET Qp1 (which is fixed at the potential 2Vref as described above), while the substrate potential-setting terminal 133 of the second N-channel MOS FET Qn2 is connected to the output terminal 190 of switch SW5. In addition, the respective gate terminals of the transistors Qp2, Qn2 are connected to that output terminal 190 of switch SW5.

The operation of the fifth analog switch SW5 of this embodiment will be described referring to FIG. 6 and the conceptual circuit diagram of FIG. 7 which illustrates the leakage current flows in the analog switch SW5 when it is set in the off condition, as occurs during each interval of the fourth condition S4 described above referring to FIG. 10. As indicated, there are two junction leakage current paths which could affect the potential of the output terminal 190 of switch SW5, with the respective leakage currents of these paths designated as $I_{21}$ and $I_{31}$. The leakage current $I_{31}$ flows through a PN junction region of the first P-channel MOS FET Qp1, to reach the output terminal 190, then through a PN junction region of the second P-channel MOS FET Qp2, i.e., the path is:

2Vref→(PN junction region of first P-channel MOS FET Qp1)→(PN junction region of second P-channel MOS FET Qp2)→ground The leakage current $I_{21}$ flows through a PN junction region of the second N-channel MOS FET Qn2, to reach the output terminal 190 of switch SW5, and then through a PN junction in the first N-channel MOS FET Qn1, i.e., the path is:

2Vref→(PN junction region of second N-channel MOS FET Qn2)→(PN junction region of first N-channel MOS FET Qn1)→ground.

With this embodiment, the substrate potentials of the first N-channel MOS FET Qn1 and the first P-channel MOS FET Qp1 are set respectively higher than and lower than the reference voltage of the switched-capacitor filter, by identical amounts. In addition the transistors Qp1, Qp2, through which the leakage current $I_{31}$ flows, have mutually identical characteristics. Thus the flow of leakage current $I_{21}$ cannot affect the potential of the output terminal 190 of switch SW5. Alternatively stated, that internal flow of leakage current cannot result in an external flow of leakage current at the output terminal 190. Similarly the transistors Qn1, Qn2, through which the leakage current $I_{21}$ flows, also have mutually identical characteristics. Hence, the flow of leakage current $I_{21}$ also cannot affect the potential of the terminal 190.

It is thus ensured that there will be no external leakage current flow at the output terminal of switch SW5 which could change the amount of charge in the capacitor C3 during each interval of the fourth condition S4, even under high temperature operation. Thus the disadvantages of the prior art described above referring to FIGS. 12 and 13 are effectively overcome.

Hence with the second embodiment, even if the sampling frequency of the switched-capacitor filter is made extremely low so that the duration of each interval of the fourth condition S4 is long, while the value of the capacitor C3 is made sufficiently small to be formed within an integrated circuit, problems do not arise due to high-temperature leakage currents in the transistors of the filter switches, and in particular the analog switch that is connected to the capacitor C3.

As can be understood from the above, the second embodiment has the following features.

Figure 7:
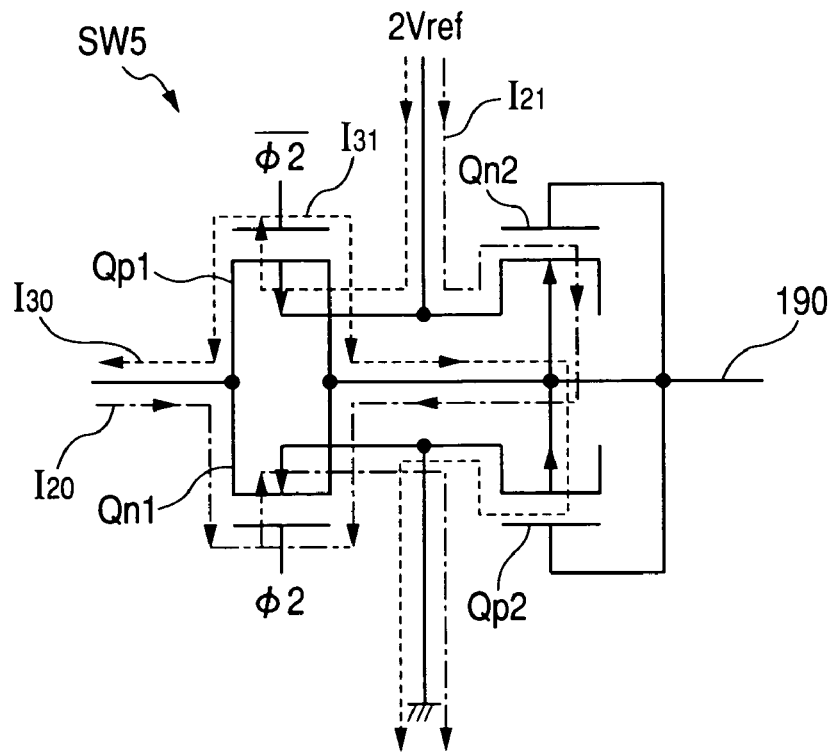
FIG. 7 is a conceptual circuit diagram of the fifth analog switch SW5 of the second embodiment, illustrating leakage current flow in the switch.

Firstly, as shown in FIG. 7, the substrate potentials of the first N-channel MOS FET Qn1 and the first P-channel MOS FET Qp1 are respectively set at a value that is more positive than the reference voltage of the switched-capacitor filter, by a specific amount, and a value which is more negative than that reference voltage, by the same specific amount. In addition, the transistors Qp1, Qp2 have matched characteristics, and the transistor Qp2 has one of its drain and source terminals connected to the substrate potential of the first N-channel MOS FET Qn1 (i.e., to ground potential), and has its substrate potential-setting terminal connected to the output terminal of the switch SW5 (which is connected to repetitively transfer charge currents to the third capacitor C3).

Similarly, the first N-channel MOS FET Qn1 and second N-channel MOS FET Qn2 have matched characteristics, and the second N-channel MOS FET Qn2 has one of its source and drain terminals connected to the substrate potential-setting terminal of the first P-channel MOS FET Qp1 (i.e., to Vref), and has its substrate potential-setting terminal connected to the output terminal of the switch SW5.

As a result of the above, it is ensured that although PN junction leakage currents will flow internally in the transistors which constitute the fifth analog switch SW5, these currents cannot adversely affect the operation of the switched-capacitor filter.

In the above description of the second embodiment it is assumed that a trench-separation configuration (i.e., separation by a dielectric material such as silicon oxide) is utilized, to isolate the MOS FETs from one another. However the embodiment could equally be implemented without utilizing such a trench-separation configuration for the MOS FETs.

Other technical concepts of the above embodiments are as follows:

(1) A switched-capacitor filter is provided in which the duration τ of the second condition S2 is made as short as possible, while being within a range of values whereby simultaneous conduction by an analog switch that is set in the conducting state by the first clock pulse signal φ1 and an analog switch that is set in the conducting state by the second clock pulse signal φ2 does not occur.

(2) A switched-capacitor filter is provided whereby:
(a) the duration τ of the second condition S2 is selected to be within a range of values whereby simultaneous conduction by an analog switch that is set in the conducting state by the first clock pulse signal φ1 and an analog switch that is set in the conducting state by the second clock pulse signal φ2 does not occur, while also,
(b) the duration of τ is made sufficiently short to ensure that flows of high-temperature leakage currents in the analog switches will not have a significant effect upon the operation of the filter.

(3) A switched-capacitor filter is provided in which the duration τ of the second condition S2 is preferably selected to be within a range from 0.6 microsecond to 2 microseconds.

(4) A switched-capacitor filter is provided in which:
(a) the duration τ of the second condition S2 is selected to be within a range of values whereby there cannot be simultaneous conduction by an analog switch that is set in the conducting state by the first clock pulse signal φ1 and an analog switch that is set in the conducting state by the second clock pulse signal φ2, and also
(b) the duration τ is made shorter than a value whereby a proportional amount of change that occurs in the charge voltage of the first capacitor C1 during the interval τ is equal to an allowable proportional amount of error in the DC gain of the switched-capacitor filter.

What is claimed is:

1. An analog switch for a switched capacitor filter that is supplied with a predetermined reference voltage and that maintains respective input and output terminals of said analog switch at said reference voltage, the analog switch comprising an N-channel MOS FET (metal-oxide semiconductor field effect transistor) and a P-channel MOS FET connected in parallel between an input terminal and an output terminal of the analog switch, said N-channel MOS FET and said P-channel MOS FET being respectively formed within a first transistor formation region and a second transistor formation region that are disposed in common within a semiconductor substrate of a single integrated circuit, and comprising a first substrate potential-setting input terminal adapted to connect said first transistor formation region to an externally supplied voltage and a second substrate potential-setting input terminal adapted to connect said second transistor formation region to said externally supplied voltage; wherein
said reference voltage is supplied to each of said first substrate potential-setting input terminal and said second substrate potential-setting input terminal, for thereby fixing respective potentials of said transistor formation region of said N-channel MOS FET and of said transistor formation region of said P-channel MOS FET at said reference voltage.

2. A switched capacitor filter comprising an operational amplifier, first, second and third capacitors, and first, second, third, fourth, fifth and sixth analog switches, and a source of a fixed reference voltage that is applied to a non-inverting input terminal of said operational amplifier, with said first analog switch being connected between an input terminal of said switched capacitor filter and a first connection node, said fourth analog switch being connected between said first connection node and said non-inverting input terminal of said operational amplifier, said first capacitor being connected between said first connection node and a second connection node, said second analog switch being connected between said second connection node and said non-inverting input terminal of said operational amplifier, said fifth analog switch being connected between said second connection node and an inverting input terminal of said operational amplifier, said second capacitor being connected between said second connection node and a third connection node, said third capacitor being connected between said inverting input terminal of said operational amplifier and an output terminal of said operational amplifier, said third analog switch being connected between said third connection node and said non-inverting input terminal of said operational amplifier, said sixth analog switch being connected between said third connection node and said output terminal of said operational amplifier, and with an output signal being produced from said output terminal of said operational amplifier, said switched capacitor filter sequentially functioning in a first operating condition, in which each of said first, second and third analog switches is in a conducting state, and each of said fourth, fifth and sixth analog switches is in a non-conducting state, whereby said first capacitor is charged to an input voltage that is applied to said input terminal of said switched capacitor filter and said second capacitor is discharged to zero, with no charging or discharging of said third capacitor occurring, a second operating condition, in which each of said first, second, third, fourth, fifth and sixth analog switches is in a non-conducting state, with no charging or discharging of said first, second and third capacitors occurring, a third operating condition, in which each of said first, second and third analog switches is in a non-conducting state, and each of said fourth, fifth and sixth analog switches is in a conducting state, whereby said second and third capacitors become connected in parallel and said first capacitor is discharged to zero, with a discharge current from said first capacitor charging said parallel-connected second and third capacitors, and a fourth operating condition, in which each of said first, second, third, fourth, fifth and sixth analog switches is in a non-conducting state, with no charging or discharging of said first, second and third capacitors occurring, with said sequence of first, second, third and fourth operating conditions being cyclically repeated; wherein a duration of said second operating condition is made substantially equal to a minimum duration whereby two or more of said first, second, third, fourth, fifth and sixth analog switches cannot be concurrently in a conducting state during said second operating condition, and said fifth analog switch is an analog switch as claimed in claim 1.

3. An analog switch for a switched capacitor filter tat is supplied with a predetermined reference voltage and that maintains respective input and output terminals of said analog switch at said reference voltage, the analog switch comprising an N-channel MOS FET (metal-oxide semiconductor field effect transistor) and a P-channel MOS FET connected in parallel between an input terminal and an output terminal of the analog switch, said N-channel MOS FET and said P-channel MOS FET being respectively formed within a first transistor formation region and a second transistor formation region that are disposed in common within a semiconductor substrate of a single integrated circuit, and comprising a first substrate potential-setting input terminal adapted to connect said first transistor formation region to an externally supplied voltage and a second substrate potential-setting input terminal adapted to connect said second transistor formation region to said externally supplied voltage; wherein said reference voltage is supplied to each of said first substrate potential-setting input terminal and said second substrate potential-setting input terminal, for thereby fixing respective potentials of said transistor formation region of said N-channel MOS FET and of said transistor formation region of said P-channel MOS FET at said reference voltage, and said analog switch comprises a continuously extending dielectric material region formed within said semiconductor substrate, disposed to surround each of respective side faces and each of respective lower faces of said first transistor formation region and of said second transistor formation region.

4. An analog switch for a switched capacitor filter that is supplied with a predetermined reference voltage and that maintains an input terminal and an output terminal of said analog switch at said reference voltage, the analog switch comprising an N-channel MOS FET (metal-oxide semiconductor field effect transistor) and a P-channel MOS FET formed in respective first and second transistor formation regions in a substrate in an integrated circuit and connected in parallel between said input terminal and output terminal of said analog switch, with said first N-channel MOS FET and said first P-channel MOS FET respectively comprising a first substrate potential-setting terminal adapted to be connected to an external voltage for setting a potential of said transistor formation region of said first N-channel MOS FET at a specific value and a second substrate potential-setting terminal adapted to be connected to an external voltage for setting a potential of said transistor formation region of said first P-channel MOS FET at a specific value, wherein said first and second substrate potential-setting terminals are supplied with respectively different values of external voltage, to thereby set said transistor formation regions of said first N-channel MOS FET and said first P-channel MOS FET at respectively different values of potential; and wherein said values of potential of said transistor formation regions of said first N-channel MOS FET and said first P-channel MOS FET are respectively higher than and lower than said reference voltage, by equal amounts, and said analog switch comprises a second P-channel MOS FET formed in a third transistor formation region in said substrate and having substantially identical operating characteristics to said first P-channel MOS FET, having one of respective drain and source terminals thereof connected to said first substrate potential-setting terminal and comprising a third substrate potential-setting terminal connected to said third transistor formation region and to said output terminal of said analog switch, and a second N-channel MOS FET formed in a fourth transistor formation region in said substrate and having substantially identical operating characteristics to said first N-channel MOS FET, having one of respective drain and source terminals thereof connected to said second substrate potential-setting terminal comprising a fourth substrate potential-setting terminal connected to said fourth transistor formation region and to said output terminal of said analog switch.

5. An analog switch comprising an N-channel MOS FET (metal-oxide semiconductor field effect transistor) and a P-channel MOS FET connected in parallel between an input terminal and an output terminal of said analog switch, with said N-channel MOS FET and said P-channel MOS FET being respectively formed within a first transistor formation region and a second transistor formation region that are disposed in common within a semiconductor substrate of an integrated circuit, said analog switch adapted to be connected within a circuit comprising means for maintaining each of respective potentials of said input terminal and output terminal at a fixed reference voltage; wherein said analog switch comprises a first substrate potential-setting input terminal adapted to connect said first transistor formation region to an externally supplied voltage and a second substrate potential-setting input terminal adapted to connect said second transistor formation region to said externally supplied voltage, and said reference voltage is supplied to each of said first substrate potential-setting input terminal and said second substrate potential-setting input terminal, for thereby fixing each of said first and second transistor formation regions at a potential that is identical to said reference voltage.

6. An analog switch as claimed in claim 5, wherein said circuit is an integrator circuit of a switched capacitor filter, said integrator circuit comprising an operational amplifier and an integrator capacitor that is connected between an output terminal of said operational amplifier and an inverting input terminal of said operational amplifier, said reference voltage is applied to a non-inverting input terminal of said operational amplifier, and said output terminal of said analog switch is connected to said inverting input terminal of said operational amplifier.

7. An analog switch as claimed in claim 5,
comprising a continuously extending dielectric material region formed within said semiconductor substrate, disposed to surround each of respective side faces and each of respective lower faces of said first transistor formation region and of said second transistor formation region.

8. An analog switch comprising an N-channel MOS FET (metal-oxide semiconductor field effect transistor) and a P-channel MOS FET formed in respective first and second transistor formation regions in a substrate in an integrated circuit and connected in parallel between said input terminal and output terminal of said analog switch, with said first N-channel MOS FET and said first P-channel MOS FET respectively comprising a first substrate potential-setting terminal adapted to be connected to an external voltage for setting a potential of said transistor formation region of said first N-channel MOS FET at a specific value and a second substrate potential-setting terminal adapted to be connected to an external voltage for setting a potential of said transistor formation region of said first P-channel MOS FET at a specific value, wherein said first and second substrate potential-setting terminals are supplied with respectively different values of external voltage, to thereby set said transistor formation regions of said first N-channel MOS FET and said first P-channel MOS FET at respectively different values of potential, said analog switch adapted to be connected within a circuit comprising means for maintaining a potential of said output terminal at a fixed reference voltage; and wherein said values of potential of said transistor formation regions of said first N-channel MOS FET and said first P-channel MOS FET are respectively higher than and lower than said reference voltage, by equal amounts, and said analog switch comprises a second P-channel MOS FET formed in a third transistor formation region in said substrate and having substantially identical operating characteristics to said first P-channel MOS FET, having one of respective drain and source terminals thereof connected to said first substrate potential-setting terminal comprising a third substrate potential-setting terminal, connected to said third transistor formation region and to said output terminal of said analog switch, and a second N-channel MOS FET formed in a fourth transistor formation region in said substrate and having substantially identical operating characteristics to said first N-channel MOS FET, having one of respective drain and source terminals thereof connected to said second substrate potential-setting terminal and comprising a fourth substrate potential-setting terminal, connected to said fourth transistor formation region and to said output terminal of said analog switch.

9. An analog switch as claimed in claim 8, wherein said circuit is an integrator circuit of a switched capacitor filter, said integrator circuit comprising an operational amplifier and an integrator capacitor that is connected between an output terminal of said operational amplifier and an inverting input terminal of said operational amplifier, said reference voltage is applied to a non-inverting input terminal of said operational amplifier, and said output terminal of said analog switch is connected to said inverting input terminal of said operational amplifier.

10. An analog switch as claimed in claim 8, wherein each of said transistor formation regions is enclosed by a region of dielectric material, extending continuously over side faces and a lower face of said transistor formation region, within said semiconductor substrate.

11. A switched capacitor filter comprising an operational amplifier, first, second and third capacitors, and first, second, third, fourth, fifth and sixth analog switches, and a source of a fixed reference voltage that is applied to a non-inverting input terminal of said operational amplifier, with said first analog switch being connected between an input terminal of said switched capacitor filter and a first connection node, said fourth analog switch being connected between said first connection node and said non-inverting input terminal of said operational amplifier, said first capacitor being connected between said first connection node and a second connection node, said second analog switch being connected between said second connection node and said non-inverting input terminal of said operational amplifier, said fifth analog switch being connected between said second connection node and an inverting input terminal of said operational amplifier, said second capacitor being connected between said second connection node and a third connection node, said third capacitor being connected between said inverting input terminal of said operational amplifier and an output terminal of said operational amplifier, said third analog switch being connected between said third connection node and said non-inverting input terminal of said operational amplifier, said sixth analog switch being connected between said third connection node and said output terminal of said operational amplifier, and with an output signal being produced from said output terminal of said operational amplifier, said switched capacitor filter sequentially functioning in a first operating condition, in which each of said first, second and third analog switches is in a conducting state, and each of said fourth, fifth and sixth analog switches is in a non-conducting state, whereby said first capacitor is charged to an input voltage that is applied to said input terminal of said switched capacitor filter and said second capacitor is discharged to zero, with no charging or discharging of said third capacitor occurring, a second operating condition, in which each of said first, second, third, fourth, fifth and sixth analog switches is in a non-conducting state, with no charging or discharging of said first, second and third capacitors occurring, a third operating condition, in which each of said first, second and third analog switches is in a non-conducting state, and each of said fourth, fifth and sixth analog switches is in a conducting state, whereby said second and third capacitors become connected in parallel and said first capacitor is discharged to zero, with a discharge current from said first capacitor charging said parallel-connected second and third capacitors, and a fourth operating condition, in which each of said first, second, third, fourth, fifth and sixth analog switches is in a non-conducting state, with no charging or discharging of said first, second and third capacitors occurring.

with said sequence of first, second, third and fourth operating conditions being cyclically repeated; wherein a duration of said second operating condition is made substantially equal to a minimum duration whereby two or more of said first, second, third, fourth, fifth and sixth analog switches cannot be concurrently in a conducting state during said second operating condition, and said fifth analog switch is an analog switch as claimed in claim 1 or claim 3.

12. A switched capacitor filter comprising an operational amplifier, first, second and third capacitors, and first, second, third, fourth, fifth and sixth analog switches, and a source of a fixed reference voltage that is applied to a non-inverting input terminal of said operational amplifier, with said first analog switch being connected between an input terminal of said switched capacitor filter and a first connection node, said fourth analog switch being connected between said first connection node and said non-inverting input terminal of said operational amplifier, said first capacitor being connected between said first connection node and a second connection node, said second analog switch being connected between said second connection node and said non-inverting input terminal of said operational amplifier, said fifth analog switch being connected between said second connection node and an inverting input terminal of said operational amplifier, said second capacitor being connected between said second connection node and a third connection node, said third capacitor being connected between said inverting input terminal of said operational amplifier and an output terminal of said operational amplifier, said third analog switch being connected between said third connection node and said non-inverting input terminal of said operational amplifier, said sixth analog switch being connected between said third connection node and said output terminal of said operational amplifier, and with an output signal being produced from said output terminal of said operational amplifier, said switched capacitor filter sequentially functioning in a first operating condition, in which each of said first, second and third analog switches is in a conducting state, and each of said fourth, fifth and sixth analog switches is in a non-conducting state, whereby said first capacitor is charged to an input voltage that is applied to said input terminal of said switched capacitor filter and said second capacitor is discharged to zero, with no charging or discharging of said third capacitor occurring, a second operating condition, in which each of said first, second third, fourth, fifth and sixth analog switches is in a non-conducting state, with no charging or discharging of said first, second and third capacitors occurring, a third operating condition, in which each of said first, second and third analog switches is in a non-conducting state, and each of said fourth, fifth and sixth analog switches is in a conducting state, whereby said second and third capacitors become connected in parallel and said first capacitor is discharged to zero, with a discharge current from said first capacitor charging said parallel-connected second and third capacitors, and a fourth operating condition, in which each of said first, second, third, fourth, fifth and sixth analog switches is in a non-conducting state, with no charging or discharging of said first, second and third capacitors occurring, with said sequence of first, second, third and fourth operating conditions being cyclically repeated; wherein a duration of said second operating condition is made substantially equal to a minimum duration whereby two or more of said first, second, third, fourth, fifth and sixth analog switches cannot be concurrently in a conducting state during said second operating condition, and said fifth analog switch is an analog switch as claimed in claim 4.

* * * * *